(12) United States Patent
Häfner et al.

(10) Patent No.: US 9,192,021 B2
(45) Date of Patent: Nov. 17, 2015

(54) LUMINOUS DEVICE COMPRISING MULTIPLE SPACED-APART EMISSION REGIONS

(75) Inventors: Norbert Häfner, Lappersdorf (DE); Michael Brandl, Mintraching (DE)

(73) Assignee: OSRAM Opto Semiconductors GmbH (DE)

( * ) Notice: Subject to any disclaimer, the term of this patent is extended or adjusted under 35 U.S.C. 154(b) by 400 days.

(21) Appl. No.: 13/877,460

(22) PCT Filed: Sep. 30, 2011

(86) PCT No.: PCT/EP2011/067156
§ 371 (c)(1),
(2), (4) Date: May 22, 2013

(87) PCT Pub. No.: WO2012/045684
PCT Pub. Date: Apr. 12, 2012

(65) Prior Publication Data
US 2013/0249396 A1 Sep. 26, 2013

(30) Foreign Application Priority Data
Oct. 4, 2010 (DE) .......................... 10 2010 047 450

(51) Int. Cl.
| | | |
|---|---|---|
| *B60Q 1/02* | (2006.01) | |
| *H05B 37/02* | (2006.01) | |
| *F21S 8/10* | (2006.01) | |
| *H05B 33/08* | (2006.01) | |
| *F21W 101/08* | (2006.01) | |
| *F21W 101/10* | (2006.01) | |
| *F21W 101/14* | (2006.01) | |
| *H01L 27/15* | (2006.01) | |

(52) U.S. Cl.
CPC ............. *H05B 37/02* (2013.01); *F21S 48/1163* (2013.01); *F21S 48/217* (2013.01); *H05B 33/0851* (2013.01); *H05B 33/0854* (2013.01); *F21W 2101/08* (2013.01); *F21W 2101/10* (2013.01); *F21W 2101/14* (2013.01); *H01L 27/156* (2013.01)

(58) Field of Classification Search
CPC ..................................................... B60Q 1/1423
USPC ......................................................... 315/82
See application file for complete search history.

(56) References Cited

U.S. PATENT DOCUMENTS

| | | |
|---|---|---|
| 6,796,690 B2 | 9/2004 | Bohlander |
| 2005/0122064 A1* | 6/2005 | Chevalier et al. ............. 315/291 |
| 2009/0128052 A1 | 5/2009 | Ries, II |
| 2009/0152569 A1 | 6/2009 | Cheng et al. |
| 2009/0322241 A1 | 12/2009 | Onushkin et al. |
| 2010/0141175 A1 | 6/2010 | Hasnain et al. |
| 2010/0163891 A1 | 7/2010 | Ku et al. |

FOREIGN PATENT DOCUMENTS

| | | |
|---|---|---|
| DE | 100 09 782 A1 | 9/2001 |
| DE | 102 30 105 A1 | 1/2003 |
| DE | 103 23 779 A1 | 1/2005 |

(Continued)

*Primary Examiner* — Daniel Puentes
(74) *Attorney, Agent, or Firm* — DLA Piper LLP (US)

(57) ABSTRACT

A luminous device includes at least one radiation-emitting semiconductor chip including at least two emission regions arranged spaced apart in a lateral direction, wherein each emission region includes at least one active zone that emits electromagnetic radiation; and a drive device that operates the emission regions.

15 Claims, 4 Drawing Sheets

(56) References Cited

FOREIGN PATENT DOCUMENTS

| DE | 10 2005 018 175 A1 | 10/2006 |
| DE | 10 2007 040 152 A1 | 3/2008 |
| DE | 10 2009 047 788 A1 | 3/2011 |
| GB | 2 454 457 A | 5/2009 |
| WO | 2006/129291 A2 | 12/2006 |
| WO | 2007/054758 A1 | 5/2007 |
| WO | 2007/071397 A1 | 6/2007 |

* cited by examiner

FIG 1
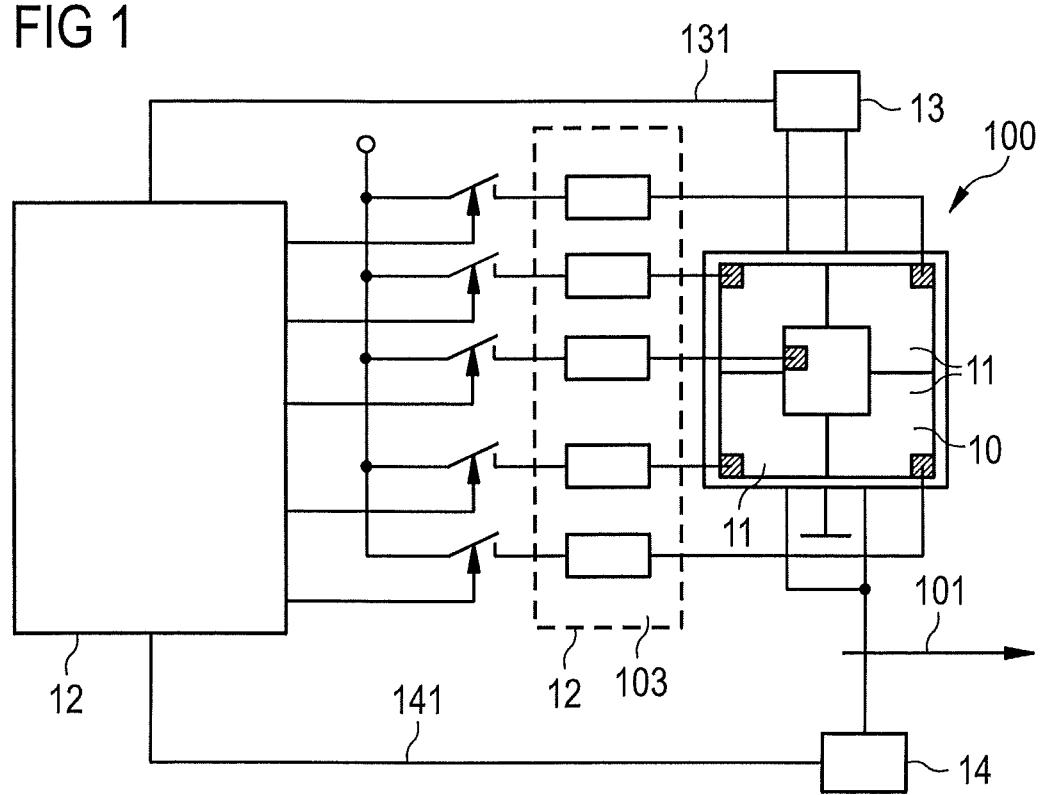
FIG 2
a) 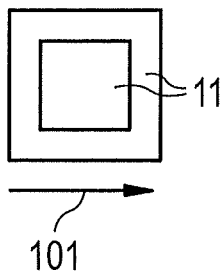
b) 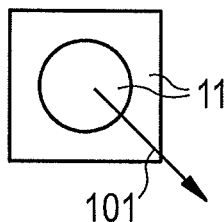
c) 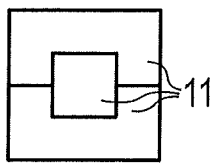
d) 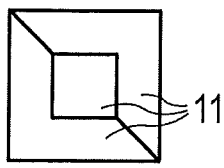
e) 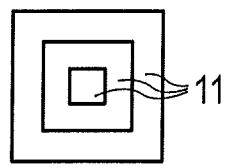
f) 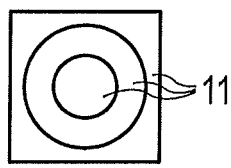

FIG 4
a)
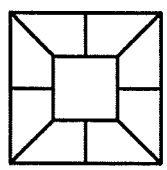
b)
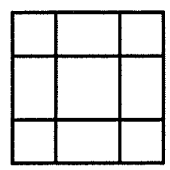
c)
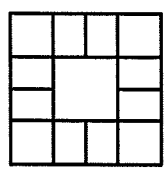
d)
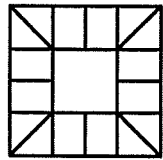
FIG 5
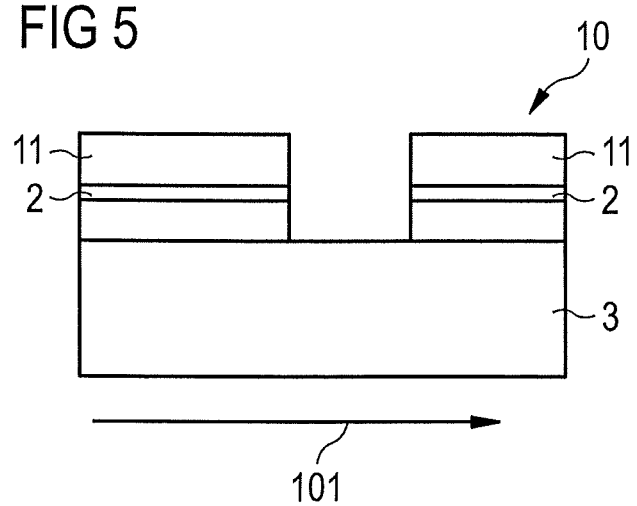

LUMINOUS DEVICE COMPRISING MULTIPLE SPACED-APART EMISSION REGIONS

TECHNICAL FIELD

This disclosure relates to a luminous device and a signal light having such a luminous device.

BACKGROUND

There is a need to provide a luminous device of compact structure and easy to produce.

SUMMARY

We provide a luminous device including at least one radiation-emitting semiconductor chip including at least two emission regions arranged spaced apart in a lateral direction, wherein each emission region includes at least one active zone that emits electromagnetic radiation; and a drive device that operates the emission regions, wherein the emission regions may be operated electrically separately from one another, and the drive device drives each emission region separately from remaining emission regions as a function of at least one of the following conditions: service period of the emission region, predeterminable minimum intensity of the electromagnetic radiation emitted by the emission region, attainment of a maximum operating temperature of the semiconductor chip, intensity of the electromagnetic radiation to be emitted by the semiconductor chip, light intensity distribution along a luminous surface of the radiation-emitting semiconductor chip, light intensity distribution along an object to be illuminated by the luminous device.

We also provide a signal light including at least one luminous device, and at least one projection surface on which the electromagnetic radiation coupled out of the luminous device impinges.

We further provide a light source in a motor vehicle headlamp, a motor vehicle rear light or a reading light including the signal light.

We further yet provide a luminous device including at least one radiation-emitting semiconductor chip including at least two emission regions arranged spaced apart in the lateral direction, wherein each emission region includes at least one active zone that emits electromagnetic radiation; and a drive device that operates the emission regions, wherein the emission regions may be operated electrically separately from one another, and the drive device drives each emission region separately from remaining emission regions as a function of at least one of service period of the emission region, predeterminable minimum intensity of the electromagnetic radiation emitted by the emission region, attainment of a maximum operating temperature of the semiconductor chip, intensity of the electromagnetic radiation emitted by the semiconductor chip, light intensity distribution along a luminous surface of the radiation-emitting semiconductor chip, light intensity distribution along an object to be illuminated by the luminous device, and at least one emission region is connected in if the intensity of the electromagnetic radiation emitted by the semiconductor chip falls below a minimum value.

BRIEF DESCRIPTION OF THE DRAWINGS

FIG. 1 is a schematic plan view of an example of a luminous device described herein.

FIGS. 2a to 4d are schematic plan views of individual examples of a radiation-emitting semiconductor chip described herein.

FIG. 5 is a schematic sectional view of an example of a semiconductor chip described herein.

DETAILED DESCRIPTION

Figure 3:
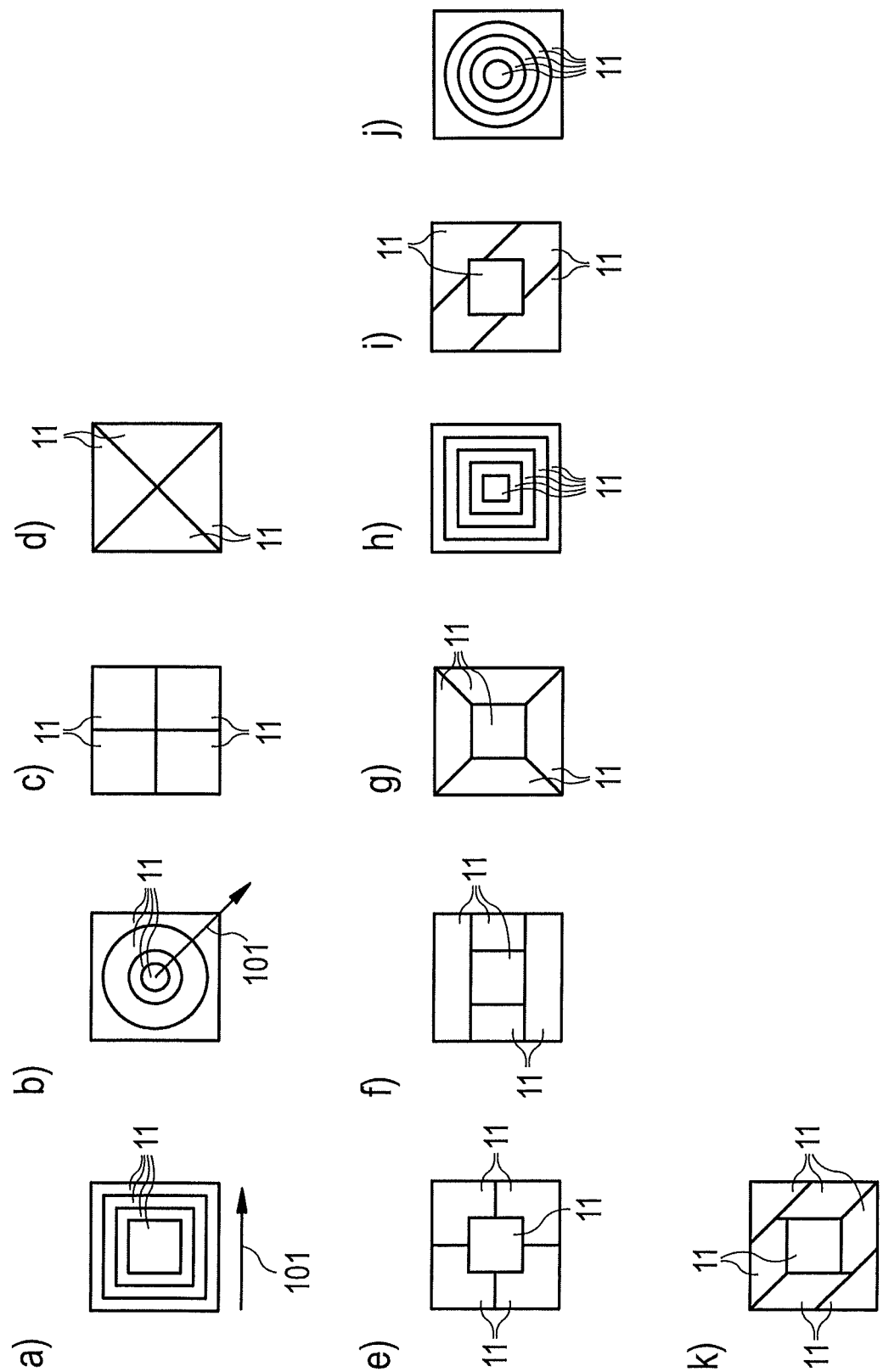

The luminous device may comprise at least one radiation-emitting semiconductor chip which comprises at least two emission regions arranged spaced apart in the lateral direction. Each of the emission regions comprises at least one active zone that emits electromagnetic radiation. "Arranged spaced apart" means, in this context, that the emission regions do not merge together and/or do not overlap one another. For example, the emission regions are formed by a semiconductor layer sequence grown epitaxially on a carrier, for example, a substrate. In this case, the lateral direction may be a direction parallel to the epitaxially grown semiconductor layer sequence. The semiconductor layer sequence may be subdivided into individual emission regions arranged spaced apart and, for example, electrically insulated from one another. At least one intermediate region is, for example, formed in the lateral direction between respective adjacent emission regions. In plan view onto the semiconductor chip, the intermediate region may be defined by side faces of the emission regions and a surface of the carrier facing the emission regions. In other words, the active zones do not adjoin the emission regions directly in the lateral direction, but rather are separated from one another by the intermediate regions.

When the active zones are contacted externally, they emit electromagnetic radiation in a wave range within the ultraviolet to infrared spectral range of electromagnetic radiation. The active zones of the radiation-emitting semiconductor chip preferably emit light in the visible or ultraviolet range of the spectrum of electromagnetic radiation. The radiation-emitting semiconductor chip is, for example, applied to a contact carrier for electrical contact. The contact carrier is, for example, a metallic board (or lead frame), a printed circuit board or a ceramic support.

The luminous device may comprise a drive device that operates the emission regions. In this context, "operating" means that the drive device may energize the emission regions predeterminably, for example, by applying electrical current and/or predeterminably by applying an operating voltage such that they emit electromagnetic radiation.

The emission regions may be electrically operated separately from one another. This may mean that current of a predeterminable intensity may be applied to the individual emission regions independently of one another. "May be operated electrically separately from one another" may likewise mean that the at least two emission regions arranged spaced apart may be predeterminably adjusted and/or controlled with regard to operating voltage, operating temperature and/or service period.

The drive device may drive each emission region separately from the other emission regions as a function of at least one of the following conditions: service period of the emission region, predeterminable minimum intensity of the electromagnetic radiation emitted by the emission region, attainment of a maximum service period for the semiconductor chip, intensity of the electromagnetic radiation to be emitted by the semiconductor chip, light intensity distribution along a luminous surface of the radiation-emitting semiconductor chip, light intensity distribution along an object to be illuminated by the luminous device. This may mean in particular that the drive device is designed to electrically operate the emission region as a function of the stated conditions separately from the other emission regions. The "luminous surface" is, for example, an outer face, remote from the carrier, of at least one of the emission regions through which electromagnetic radiation generated at least in part within the semiconductor chip leaves the semiconductor chip.

The luminous device described herein is based inter alia on the recognition that adjusting and/or modulating a radiant intensity generated by a radiation-emitting semiconductor chip within a luminous device is possible only with a great deal of effort. To adjust the radiant intensity it is possible to operate the semiconductor chip with different levels of energization. However, this may be associated with fluctuations in the radiant intensity and/or color location of the electromagnetic radiation emitted by the semiconductor chip during operation of the luminous device. Such a variation in the level of energization may additionally be associated with non-linearity between the level of energization and the operating voltage during operation. Alternatively or in addition, the radiation-emitting semiconductor chip may be driven by a pulse width modulation (or PWM) signal and the semiconductor chip may therefore be switched on and off in quick succession to be able to generate a lower radiant intensity. However, this manner of driving the radiation-emitting semiconductor chip requires additional electronic components to generate the pulse width modulation signal inside the luminous device.

If, on the other hand, it is desired to generate high semiconductor chip radiant intensities, associated high currents may cause electromagnetic interference inside the semiconductor chip or inside the electronic components of the luminous device, which may be suppressed or prevented by additional components within the luminous device. However, such additional components may lead to high manufacturing costs and result in a luminous device of a less than compact structure.

If the luminous device comprises at least two radiation-emitting semiconductor chips to adjust radiant intensity, these may each be operated at different energization levels. Although such operation of semiconductor chips is inexpensive, it applies tight, pre-specified specification requirements to the respective semiconductor chip. Such preselection of suitable radiation-emitting semiconductor chips may bring with it additional luminous device production costs. In this case the luminous device may not be very compact since separate energization or a separate power supply has, for example, to be examined for each of the radiation-emitting semiconductor chips.

To provide a luminous device which is on the one hand inexpensive to produce and on the other hand is of simple and compact construction, the luminous device makes use, inter alia, of the concept of providing at least one radiation-emitting semiconductor chip which comprises at least two emission regions spaced apart in the lateral direction. In other words, the above-described radiation-emitting semiconductor chip is subdivided into at least two emission regions, wherein each of the emission regions may be operated and driven by the common drive device of the luminous device, i.e., it is possible, using the drive device, that is with minimum effort, to adapt and adjust the radiant intensity of the luminous device individually to the user's necessary requirements through energization of the individual emission regions. Emission regions not suitable and/or not needed are, for example, not operated by the drive circuit. There is therefore no need for narrow selection of the individual emission regions, for example, with regard to their emitted color location. Such a luminous device is advantageously inexpensive to produce and of simple and compact construction.

The radiation-emitting semiconductor chip may comprise the carrier, wherein at least two of the emission regions are epitaxially jointly grown and fixed jointly to the carrier. The carrier may, for example, be a growth substrate on which at least two of the emission regions may jointly be grown epitaxially. The carrier may, for example, also form a carrier substrate on which at least two of the emission regions epitaxially jointly grown on a growth substrate are fixed. In this context, "jointly" means that at least two of the emission regions are grown and/or fixed simultaneously and in at least one method step, wherein the emission regions divide the carrier in the form of a growth substrate or carrier substrate. In other words, at least two of the emission regions form on the carrier, wherein the individual emission regions may also be formed only after the epitaxial growth. If the luminous device comprises a plurality of carriers, at least two of the emission regions are arranged adjacent one another in the lateral direction on at least one of the carriers.

At least two of the emission regions may form a common boundary surface in the lateral direction. This may mean that the emission regions touch or abut one another or are contiguous in the lateral direction.

The active zones of the emission regions may be separated from one another and the emission regions may not be in direct contact.

The lateral distance between at least two of the emission regions preferably amounts to less than 2.5% or less than 5% or less than 10% of the average lateral extent of the individual emission region, i.e., the distance between two emission regions is small in comparison to the lateral extents of the emission region.

Due to joint growth, the emission regions may in particular exhibit the same extent in the vertical direction, the same semiconductor layer sequence, the same extent in the vertical direction of the individual semiconductor layers and/or the same material composition.

The vertical direction here extends, for example, parallel to a direction of growth of the epitaxially grown semiconductor layers of the radiation-emitting semiconductor chip.

The drive device may dim or deactivate an emission region operated by the drive device once at least one of the conditions has been reached for the emission region. In this context, "dimming" means that the emission region continues to be operated after at least one of the conditions is reached, for example, with a lower operating and/or current voltage. In other words, the radiant intensity emitted by the dimmed emission region is reduced. It is conceivable that at least one of the emission regions may exceed a predeterminable operating temperature during operation of the luminous device. An emission region which overheats in this way may be protected from overheating by the drive device, for example, by reducing an energizing and/or operating voltage, i.e., by dimming. It is advantageously possible in the case of such an emission region to reduce power loss once the maximum operating temperature has been reached to thereby protect the emission region itself and, for example, likewise the radiation-emitting semiconductor chip from destruction.

"Deactivation" may mean that an electrically conductive connection between an external energy source and the emission region is broken by the drive device once at least one of the conditions is achieved. Current is no longer applied to deactivated emission regions during operation of the luminous device. Deactivated emission regions are therefore also no longer operated. Emission regions already spent during operation of the luminous device may, for example, reduce the optical output power of the luminous device. In this context, "spent emission regions" means that after a certain service period such emission regions no longer fulfil the general specifications applied thereto such as, for example, the intensity of the emitted light. By deactivating the spent emission regions, negative effects, for example, with regard to the optical output power and/or operating stability of the luminous device, are prevented, even though the emission region may remain connected throughout the service period.

The number of emission regions in operation during operation of the luminous device may be constant. An emission region that has exceeded its service life may, for example, be deactivated by the drive device and a hitherto unoperated emission region may be operated in its place. Advantageously, the radiant intensity emitted by the semiconductor chip may be kept constant over the entire operating time.

At least one emission region may be connected in if the intensity of the electromagnetic radiation emitted by the semiconductor chip falls below a minimum value. For example, at the start of operation of the luminous device for illumination purposes, not all the emission regions are required, i.e., at the start of operation of the luminous device only a given number of emission regions are operated by the drive device. The hitherto unused and thus hitherto unoperated emission regions may be connected in, for example, at the end of the service life of an emission region operated right from the start such that the intensity of the electromagnetic radiation to be emitted by the radiation-emitting semiconductor chip does not fall below a predeterminable value. In other words, connecting in as yet unused emission regions can counteract a drop in the intensity emitted by the radiation-emitting semiconductor chip to below a threshold value.

The intensity emitted by the semiconductor chip during operation of the luminous device may be kept constant by the drive device. It is also possible in this respect that at the start of operation of the luminous device not all the emission regions are operated. As yet unoperated emission regions may be connected in stages as a function of the decrease in radiant intensities during operation of the emission regions. This allows an external observer to perceive a constant brightness and/or illumination pattern of the luminous device in the far field. The operating criteria applied to the luminous device may thus be kept constant over as long a period as possible, so significantly prolonging the service life of the luminous device.

At least one emission region may be surrounded at least in places by the other emission regions, wherein in a first operating mode of the luminous device only the surrounded emission region is operated by the drive device and in a second operating mode at least one of the other emission regions is operated. In this context, "operating mode" means externally predeterminable operation of the emission regions by the drive device, for example, with regard to the following operating parameters: energization level, operating voltage, service period and/or operating temperature. The first operating mode differs from the second operating mode in at least one the stated operating parameters. During a predeterminable operating period, i.e., the predeterminable duration of one operating mode, the operating parameters with which the luminous device is operated may be unchanged. The first and second operating modes may then merge at a predeterminable time, for example, through a sudden shift or as a function of a predeterminable time interval, for example, continuously or in stages.

Only the other emission regions are operated by the drive device in the second operating mode, i.e., the surrounded emission region is not operated by the drive device in the second operating mode. No current is then applied to the surrounded emission region, for example, apart from leakage currents.

In the second operating mode all the emission regions may be operated by the drive device, i.e., in the second operating mode current of a level in each case predeterminable by the drive device is applied into all the emission regions.

The intensity of the electromagnetic radiation emitted by the semiconductor chip in the second operating mode may be at least five times and at most fifteen times, preferably at least seven and at most twelve times, as high as in the first operating mode.

The intensity of the electromagnetic radiation emitted by the semiconductor chip in the first operating mode may be at least five times and at most fifteen times, preferably at least seven and at most thirteen times, as high as in the second operating mode.

The drive device may connect in at least one emission region if the ambient brightness of the luminous device falls below a given value or disconnects at least one emission region if the ambient brightness of the luminous device exceeds a given value. For example, the luminous device may comprise a brightness sensor which measures the ambient brightness surrounding the luminous device and transmits these measured data to the drive device after appropriate analogue and/or digital conversion, the drive device connecting in or disconnecting at least one emission region on the basis of these measured data. Such a luminous device may, for example, be used in streetlights, beginning to emit an ever higher intensity of light as daylight decreases by connecting in at least one emission region and conversely beginning to emit an ever lower intensity as daylight increases again. By connecting in and disconnecting emission regions, particularly simple dimming is in general achieved, without a pulse width modulation circuit being needed.

We further provide a signal light.

The signal light may comprise at least one luminous device as described in one or more of the examples described herein, i.e., the features listed for the luminous device described herein are also disclosed for the signal light described herein The signal light may comprise at least one projection surface on which the electromagnetic radiation coupled out of the luminous device impinges. The projection face is, for example, an at least partially radiation-transmissive shade. This shade is, for example, integrated into a reflecting and/or radiation-outcoupling means of the signal light. Light coupled out of the luminous device may impinge on the projection surface and be coupled thereby at least partially out of the signal light.

The signal light is, for example, a motor vehicle headlamp or used in a motor vehicle headlamp. Such a motor vehicle headlamp may be a daytime running light, which during the day, i.e., for example, in the first operating mode, emits an intensity which is, for example, ten times greater than that emitted at night, i.e., in the second operating mode. The motor vehicle headlamp may further be a motor vehicle end-outline marker lamp (or position lamp).

The signal light may likewise be a motor vehicle rear light or be used in a motor vehicle rear light. On braking of the motor vehicle, for example, the intensity of the electromagnetic radiation emitted by the luminous device increases several times, for example, ten times. In this respect, braking may constitute the second operating mode of the luminous device and free running of the motor vehicle, i.e., without brake actuation, the first operating mode of the luminous device. The intensity of the braking procedure may, for example, also be expressed by the second operating mode. It is possible that the second operating mode then corresponds to emergency braking of the motor vehicle or the luminous device lights up more brightly, the further the brake pedal is depressed.

It is likewise possible for the signal light to be backlighting, for example, for LCD displays which, as a function of ambient brightness, provides higher intensity backlighting for the LCD display by day and lower intensity backlighting at night or vice versa. "High intensity" may mean that, in a first operating mode, only the emission regions surrounding an emission region are operated by the drive device and when it is dark, i.e., in the second operating mode, only the surrounded emission region is operated by the drive device.

The signal light may further be a reading light or be used in a reading light. If the signal light is used in a motor vehicle, the intensity of electromagnetic radiation emitted by the reading light is constant even if the motor vehicle battery voltage fluctuates. For example, at least one emission region is connected in or, for example, dimmed by the drive device as a function of motor vehicle battery voltage. In other words, the drive device may compensate for a fluctuating battery voltage.

The signal light is likewise suitable as escape route lighting which normally merely marks the escape route, i.e., in the first operating mode of the luminous device only the surrounded emission region is operated by the drive device and in emergencies the luminous intensity is increased up to an emergency lighting level which may correspond to the second operating mode of the luminous device. In the second operating mode, all the emission regions may, for example, be operated by the drive device.

If the luminous device is used, for example, in a headlamp with a reflector, it is possible to operate the individual emission regions using operating voltages of different intensities, i.e., to homogenize the emission images of the luminous device in the event of different driving intensities of the emission regions, which images would otherwise appear non-uniform due to the manufacturing tolerances of the reflector of such a headlamp.

The luminous device may likewise be used in lighting applications for image recording since suitable illumination, up to the point of accentuation of different regions, may be achieved by targeted driving of the emission regions by the drive device.

In addition, emission regions operated individually by the drive device may illuminate individual regions of a reflector, for example, of the signal light projection surface described herein to produce a lighting pattern variable over time, as arises with bending lights.

It is additionally possible for the luminous device to provide ambient lighting in the first operating mode, for example, during an aircraft flight and in a second operating mode to provide boarding and alighting lighting, for example, for boarding and alighting from the aircraft.

The luminous device described herein and the signal light described herein are explained in greater detail below with reference to examples and the associated figures.

In the examples and figures, identical or identically acting components are in each case provided with the same reference numerals. The elements shown should not be considered as being to scale, but rather individual elements may be shown exaggeratedly large to assist in understanding.

FIG. 1 shows a schematic plan view of a luminous device 100 described herein with a radiation-emitting semiconductor chip 10 and a drive device 12. The radiation-emitting semiconductor chip 10 comprises a total of five emission regions 11 arranged spaced apart in the lateral direction 101. The lateral direction 101 is a direction parallel to the main direction of extension of the semiconductor chip 10 and is dependent on the selected reference system within the semiconductor chip 10, for example, the lateral direction 101 is a direction, in the main plane of extension of the semiconductor chip, which encircles the semiconductor chip 10. If the semiconductor chip 10 exhibits circular emission regions 11, the lateral direction 101 may be a direction in the main plane of extension of the semiconductor chip 100 parallel to the diameters of the individual emission regions 11.

Each of the emission regions 11 comprises at least one active zone 2 that emits electromagnetic radiation (not shown, see FIG. 5). The drive device 12 operates each of the emission regions 11 separately from the remaining emission regions 11 with regard to a service period of the emission region 11, predeterminable minimum intensity of the electromagnetic radiation emitted by the emission region 11, attainment of a maximum service period for the semiconductor chip 10, intensity of the electromagnetic radiation to be emitted by the semiconductor chip 10, light intensity distribution along a luminous surface of the radiation-emitting semiconductor chip 10 and light intensity distribution of an object to be illuminated by the luminous device 100. The number of emission regions 11 in operation is constant during operation of the luminous device 100, wherein at least one emission region 11 is connected in if the intensity of the electromagnetic radiation to be emitted by the semiconductor chip 10 falls below a minimum value. To this end, the drive device 12 deactivates the respective spent emission region 11, the connected-in emission region 11 replacing spent emission region 11.

The drive device 12 further comprises a protective resistor configuration 103. With the protective resistor configuration 103, a variable and/or fluctuating external operating voltage may be compensated such that specific operating parameters and requirements relating to the luminous device 100 may be complied with and a maximally constant intensity of electromagnetic radiation emitted by the semiconductor chip 10 is ensured over the entire service period.

The luminous device 100 additionally comprises at least one brightness sensor 13 and/or at least one temperature sensor 14. The brightness sensor 13 and the temperature sensor 14 are, for example, included in the drive device 12 itself or arranged separately of the drive device 12 inside the luminous device 100.

The brightness sensor 13 measures the ambient brightness of the luminous device 100. After analogue and/or digital conversion of the measured brightness values, measured by the brightness sensor 13, the values are transmitted to the drive device 12 by a transmission line 131. On the basis of the measured values of the brightness sensor 13, the drive device 12, for example, connects in at least one emission region 11, as required, in the event of a reduction in brightness.

The temperature sensor 14 measures the operating temperature of each of the emission regions 11 operated by the drive device 12. The appropriately converted measured temperature values are also transmitted to the drive device 12 by a further transmission line 141. As a function of the measured temperature values, the drive device 12 may dim or deactivate at least one hitherto operated emission region 11.

FIGS. 2 to 4 are schematic plan views of individual examples of a radiation-emitting semiconductor chip 10 described herein.

In this respect, the radiation-emitting semiconductor chips 10 illustrated in FIGS. 2a and 2b each have two emission regions 11 arranged spaced apart in the lateral direction 101.

In FIGS. 2c to 2f the radiation-emitting semiconductor chips 10 each comprise three emission regions 11.

It is apparent from the stated figures that at least one emission region 11 is in each case completely surrounded by at least one other emission region 11. In other words, the emission region 11 which is in each case surrounded forms a central emission region 11 of the semiconductor chip 10, while the surrounding emission regions 11 together form at least one peripheral emission region of the radiation-emitting semiconductor chip 10.

In FIGS. 3a to 3d the radiation-emitting semiconductor chips 10 each comprise four emission regions 11 and in FIGS. 3e to 3j they each comprise five emission regions 11.

In addition, the radiation-emitting semiconductor chips 10 of FIG. 3k comprise seven emission regions 11, FIGS. 4a and 4b nine emission regions 11, FIG. 4c thirteen emission regions 11 and FIG. 4d seventeen emission regions 11.

In other words, the radiation-emitting semiconductor chips 10 may comprise emission regions 11 arranged predeterminably as required and in each case shaped geometrically individually such that an emission pattern matching the requirements placed on the luminous device 100 can be obtained.

FIG. 5 is a schematic sectional representation of a radiation-emitting semiconductor chip 10 described herein in which two neighboring emission regions 11 in the lateral direction 101 are deposited epitaxially on a carrier 3, for example, a substrate. FIG. 5 shows that the emission regions 11 are spaced apart in the lateral direction 101 in each case by an intermediate region 111. In other words, the active zones 2 of the emission regions 11 are separated from one another. The active zones 2 therefore do not adjoin one another directly in the lateral direction 101.

Figure 6:
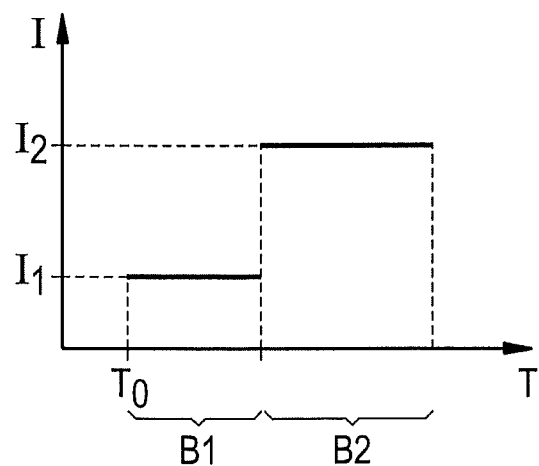
FIG. 6 shows a schematic I-T diagram of different operating modes of the luminous device.

FIG. 6 is a schematic I-T diagram of different operating modes of the luminous device 100. In a first operating mode B1, only one emission region 11 surrounded by the other emission regions 11 is operated by the drive device 12 in the period $T_0$ to $T_1$ inclusive. The luminous device 100 therefore emits electromagnetic radiation only with an intensity $I_1$. At the time $T_1$ the drive device 12 switches in an externally predeterminable manner from operating mode B1 to a second operating mode B2. In the second operating mode B2 all the emission regions 11 are operated by the drive device 12, i.e., an intensity $I_2$ emitted by the luminous device 100 is greater in the second operating mode than the intensity $I_1$ during the first operating mode B1. The luminous device 100 is, for example, a brake light which, during free running, i.e., without braking, is in the first operating mode B1 and at the time of braking, for example, through actuation of the brake pedal and/or a braking device, changes over from operating mode B1 to braking mode, i.e., to operating mode B2. The intensity $I_2$ on braking is then, for example, ten times greater than the intensity $I_1$.

Figure 7A:
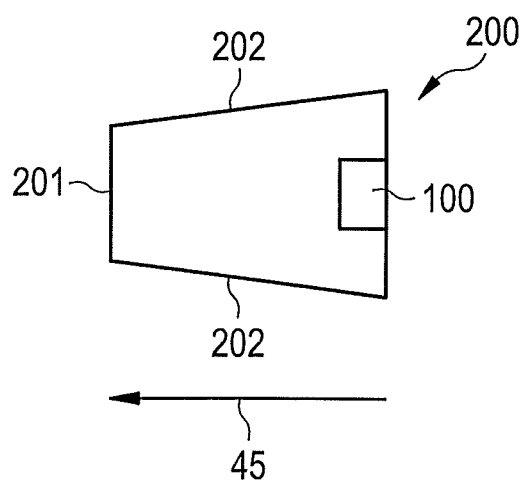
FIGS. 7A and 7B are schematic views of an example of a signal light described herein.
Figure 7B:
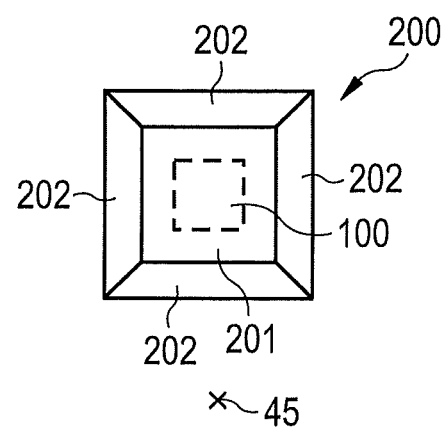

FIGS. 7A and 7B are schematic side views of a signal light 200 described herein. The signal light 200 comprises the luminous device 100. The luminous device 100 emits electromagnetic radiation of a predeterminable intensity in the direction of a projection surface 201. The projection surface 201 is, for example, formed of a glass or radiation-transmissive plastics. The electromagnetic radiation emitted from the luminous device 100 is coupled out of the signal light 200 at least in part via the projection surface 201. Both the luminous device 100 and the projection surface 201 are bordered in a direction transverse to a radiation exit direction 45 of the luminous device 100 by at least one reflecting body 202, the reflecting body 202 concentrating electromagnetic radiation impinging thereon at least in part in the direction of the projection surface 201. The reflecting body 202 is, for example, a light-guiding element or at least part of such an element. In this case, the reflecting body 202 may be an optical fiber or part of an optical fiber.

In FIG. 7B the signal light 200 is shown in the direction from the projection surface 201 towards the luminous device 200, i.e., contrary to the radiation exit direction 45. Dashed lines in turn show the luminous device 100 which is concealed by the projection surface 201. The signal light 200 described in FIGS. 7A and 7B is, for example, a motor vehicle headlamp, a luminaire, a motor vehicle rear light or a reading light.

Our devices are not restricted by the description given with reference to the examples. Rather, this disclosure encompasses any novel feature and any combination of features, including in particular any combination of features in the appended claims, even if the feature or combination is not itself explicitly indicated in the claims or the examples.

The invention claimed is:

1. A luminous device comprising:
   at least one radiation-emitting semiconductor chip comprising at least two emission regions arranged spaced apart in a lateral direction, wherein each emission region comprises at least one active zone that emits electromagnetic radiation; and
   a drive device that operates the emission regions, wherein the emission regions may be operated electrically separately from one another, and
   the drive device drives each emission region separately from remaining emission regions as a function of at least one of the following conditions: service period of the emission region, predeterminable minimum intensity of the electromagnetic radiation emitted by the emission region, attainment of a maximum operating temperature of the semiconductor chip, intensity of the electromagnetic radiation to be emitted by the semiconductor chip, light intensity distribution along a luminous surface of the radiation-emitting semiconductor chip, light intensity distribution along an object to be illuminated by the luminous device.

2. The luminous device according to claim 1, wherein the drive device connects in at least one emission region if the ambient brightness of the luminous device falls below a given value or disconnects at least one emission region if the ambient brightness of the luminous device exceeds a given value.

3. The luminous device according to claim 1, wherein the drive device dims or deactivates an emission region operated by said drive device once at least one condition has been reached for said emission region.

4. The luminous device according to claim 1, wherein the number of emission regions in operation during operation of the luminous device is constant.

5. The luminous device according to claim 1, wherein intensity emitted by the semiconductor chip during operation of the luminous device is kept constant by the drive device.

6. The luminous device according to claim 1, wherein at least one emission region is surrounded at least in places by other emission regions, and wherein in a first operating mode (B1) of the luminous device only the surrounded emission region is operated by the drive device and in a second operating mode (B2) at least one of the other emission regions is operated.

7. The luminous device according to claim 6, wherein in the second operating mode (B2) only the other emission regions are operated by the drive device.

8. The luminous device according to claim 6, wherein in the second operating mode (B2) all the emission regions are operated by the drive circuit.

9. The luminous device according to claim 6, wherein intensity of the electromagnetic radiation emitted by the semiconductor chip in the second operating mode (B2) is at least five times and at most fifteen times as high as in the first operating mode (B1).

10. The luminous device according to claim 6, wherein intensity of the electromagnetic radiation emitted by the semiconductor chip in the first operating mode (B1) is at least five times and at most fifteen times as high as in the second operating mode (B2).

11. The luminous device according to claim 1, wherein drive device connects in at least one emission region if ambient brightness of the luminous device falls below a given value or disconnects at least one emission region if the ambient brightness of the luminous device exceeds a given value.

12. A signal light comprising:
at least one luminous device according to claim 1, and
at least one projection surface on which the electromagnetic radiation coupled out of the luminous device impinges.

13. A light source in a motor vehicle headlamp, a motor vehicle rear light or a reading light comprising the signal light according to claim 12.

14. A method of producing a luminous device according to claim 1, comprising:
providing a carrier in form of a growth substrate formed from one single piece;
epitaxially jointly growing at least two emission regions spaced apart in a lateral direction on the growth substrate such that the emission regions show the same extent in the vertical direction, the same semiconductor layer sequence, the same extent in the vertical direction of the individual semiconductor layers and the same material composition, wherein each emission region comprises at least one active zone that emits electromagnetic radiation;
providing and connecting a drive device to the emission regions,
wherein in the finished luminous device:
the emission regions remain on the growth substrate,
the growth substrate remains formed from one single piece,
the lateral distance between the emission regions is the same as during the growth process wherein, during operation of the finished luminous device:
the drive device operates the emission regions, and
the drive device drives each emission region separately from remaining emission regions as a function of at least one of service period of the emission region, predeterminable minimum intensity of the electromagnetic radiation emitted by the emission region, attainment of a maximum operating temperature of the semiconductor chip, intensity of the electromagnetic radiation emitted by the semiconductor chip, light intensity distribution along a luminous surface of the radiation-emitting semiconductor chip, light intensity distribution along an object to be illuminated by the luminous device.

15. A luminous device comprising:
at least one radiation-emitting semiconductor chip comprising at least two emission regions arranged spaced apart in a lateral direction, wherein each emission region comprises at least one active zone that emits electromagnetic radiation; the radiation-emitting semiconductor chip comprises at least one carrier, at least two of the emission regions are epitaxially jointly grown and fixed jointly to the carrier, the distance between two emission regions is less than 10% of an average lateral extent of an individual emission region, and the emission regions show the same extent in the vertical direction, the same semiconductor layer sequence, the same extent in the vertical direction of the individual semiconductor layers, and the same material composition; and
a drive device that operates the emission regions,
wherein
the emission regions may be operated electrically separately from one another, and
the drive device drives each emission region separately from remaining emission regions as a function of at least one of service period of the emission region, predeterminable minimum intensity of the electromagnetic radiation emitted by the emission region, attainment of a maximum operating temperature of the semiconductor chip, intensity of the electromagnetic radiation emitted by the semiconductor chip, light intensity distribution along a luminous surface of the radiation-emitting semiconductor chip, light intensity distribution along an object to be illuminated by the luminous device.

* * * * *